United States Patent [19]

Ko

[11] Patent Number: 5,192,951

[45] Date of Patent: Mar. 9, 1993

[54] ANALOG-TO-DIGITAL CONVERTER CIRCUITS AND METHODS USING SUPERCONDUCTIVE ELEMENTS

[75] Inventor: Herbert L Ko, Mountain View, Calif.

[73] Assignee: Hewlett-Packard Company, Palo Alto, Calif.

[21] Appl. No.: 796,276

[22] Filed: Nov. 22, 1991

[51] Int. Cl.⁵ .............................................. H03M 1/34
[52] U.S. Cl. ..................................... 341/133; 505/827
[58] Field of Search ............... 341/133, 155, 158, 159, 341/161, 118, 120; 505/827, 845, 842; 307/306, 476, 277

[56] References Cited

U.S. PATENT DOCUMENTS

| | | | |
|---|---|---|---|
| 4,623,804 | 11/1986 | Goto | 307/476 |
| 4,866,373 | 9/1989 | Harada et al. | 324/127 |
| 4,916,335 | 4/1990 | Goto et al. | 307/306 |
| 4,956,642 | 9/1990 | Harada | 341/133 |
| 4,977,402 | 12/1990 | Ko | 341/133 |

Primary Examiner—A. D. Pellinen
Assistant Examiner—Brian K. Young

[57] ABSTRACT

The present invention is directed to dynamically adjusting the threshold of a magnetic flux sensitive comparator to permit matching of circuit elements for use in A/D converters. For example, comparator threshold variations can be adjusted or programmed to compensate for variations in device components such as resistors. By overcoming parameter matching problems, superconductive A/D converters designed in accordance with the present invention can provide relatively high bandwidth and sampling rates.

14 Claims, 6 Drawing Sheets

ANALOG-TO-DIGITAL CONVERTER CIRCUITS AND METHODS USING SUPERCONDUCTIVE ELEMENTS

BACKGROUND OF THE INVENTION

1. Field of the Invention

The present invention relates generally to signal processing. More particularly, the invention relates to circuits and methods for analog-to-digital (A/D) conversion using a threshold comparator which includes superconducting devices.

2. State of the Art

Known signal processors include comparators for processing analog signals into digital signals. To address the need for faster, more accurate signal processing, A/D converters have been proposed which include comparator circuits formed with superconducting elements, such as Josephson junction elements (i.e., Josephson junctions).

Josephson junctions are described in a document entitled "Superconducting electronics", *Physics Today*, February 1981 by Donald G. McDonald, the disclosure of which is hereby incorporated by reference in its entirety. As described therein, Josephson junctions are devices which exploit the concept of magnetic flux quantization. Generally speaking, magnetic flux quantization refers to the ability of superconducting loops, or rings, to trap the magnetic field of a permanently circulating supercurrent.

Josephson junctions are typically formed from two thin films of superconducting metals separated by a thin insulating layer. An electrical current is conducted across the two thin films with zero voltage drop provided the current is below a predetermined maximum level (e.g., approximately lmA) referred to as the "critical current".

Comparator circuits formed with Josephson junctions generally fall into one of two classes: those that directly detect injected currents, and those that detect magnetic flux. Examples of the former include a single Josephson junction sampling gate and a pair of Josephson junctions operated in a differential mode. Examples of the latter include Superconducting Quantum Interference Devices (i.e., SQUIDs) and Quantum Flux Parametrons (i.e., QFPs).

A SQUID is typically formed as a superconducting loop interrupted by two Josephson junctions. Maximum current through the superconducting loop occurs when either junction reaches its critical current. Because the maximum current is a periodic function of magnetic flux through the SQUID, these devices provide a finely graded measuring scale for magnetic flux detection. The frequency with which the maximum current is detected (i.e., the frequency with which a voltage drop is detected across at least one Josephson junction) represents a measure of magnetic flux through the SQUID.

A document entitled "A Single-Chip SQUID Magnetometer", *IEEE Transactions On Electron Devices*, Vol. 35, No. 12, December 1988 by Norio Fujimaki et al. further describes a SQUID magnetometer for quantizing and permanently storing flux in a superconducting loop. The SQUID magnetometer includes a SQUID sensor which changes from a zero-voltage state to a finite voltage state (e.g., approximately lmV) when an AC bias current pulse crosses a threshold value. The threshold value is a function of magnetic flux coupled to the SQUID and depends upon characteristics of the SQUID sensor (i.e., the inductance, the Josephson junction critical currents and the location of the bias current injection point).

A known QFP used for polarity discrimination of an input signal is disclosed in U.S. Pat. No. 4,916,335 (Goto et al), the disclosure of which is hereby incorporated by reference in it entirety. See also "Basic Operations of the Quantum Flux Parametron", Harada, Y. et al., MAG-23, September 1987, p. 3801. Like the SQUID, a QFP typically includes a superconducting loop interrupted by two Josephson junctions for amplifying weak magnetic flux. As the center node inductance of a QFP is increased, its functional behavior approaches that of a SQUID.

Single pass Josephson junction A/D converters have been designed using SQUIDs with two and three Josephson junctions (see, for example, "Superconducting A/D Converter Using Latching Comparators", C. A. Hamilton et al., IEEE Tran. Magn., vol MAG-21, pp. 197–199 and "Analog Signal Processing With Josephson Junctions: Analog to Digital Conversion", Spargo et al., Extended Abstracts of the 1987 International Superconductivity Electronics Conference, Aug. 28, 1987, Tokyo, pp. 319–334). Single pass A/D converters are attractive because of their increased conversion speed relative to known multiple pass A/D converters (e.g., successive approximation and parallel feed-forward A/D converters). However, implementation of a fully parallel A/D converter, which requires $2^n - 1$ comparators for n bits of resolution has not been practical in superconductive circuits because of the tight tolerance required in the components. (See, for example, G. S. Lee and D. A. Petersen, *Superconductive A/D Converters*, Proceedings of the IEEE, 77(8) August 1989, P. 1264).

The foregoing limitations can be traced to a general problem with implementing high resolution converters; i.e., an inability to produce devices with uniform characteristics. For example, a significant barrier to making superconductive A/D converters has been the difficulty in matching circuit elements, such as resistors and Josephson junctions.

SUMMARY OF THE INVENTION

Accordingly, the present invention is directed to dynamically adjusting the threshold of a magnetic flux sensitive comparator to permit matching of circuit elements for use in A/D converters. For example, comparator threshold variations can be adjusted or programmed to compensate for variations in device components such as resistors. By overcoming parameter matching problems, superconductive A/D converters designed in accordance with the present invention can provide relatively high bandwidth and sampling rates.

In accordance with the present invention, magnetic flux quantization is exploited to provide a threshold compensation feature. A preferred A/D converter includes a QFP with externally triggered feedback such that a feedback gate can be selectively enabled to program comparator thresholds.

In a preferred embodiment, the invention relates to an apparatus and method for converting an analog input signal to a digital signal. A preferred apparatus includes input means for inputting an analog signal; comparator means for comparing the analog signal with at least one predetermined threshold, said comparator means including first means for quantizing flux; output means for outputting a signal proportional to a value of said analog value in response to said comparison; and feedback means for compensating asymmetries in the comparator means.

BRIEF DESCRIPTION OF THE DRAWINGS

Other purposes and advantages of the present invention will become more apparent from the following detailed description of preferred embodiments when read in conjunction with the accompanying drawings, wherein like elements are designated by like numerals and wherein:

FIGS. 4a-e show an alternate exemplary embodiment of a QFP wherein comparator trigger times have been compensated to provide timing and adjustment;

DETAILED DESCRIPTION OF THE PREFERRED EMBODIMENTS

Figure 1:
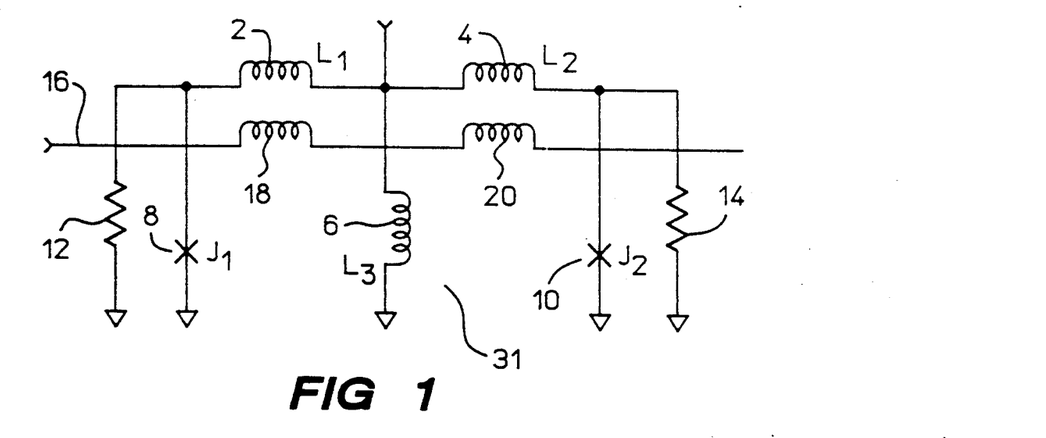
FIGS. 1 and 2a show exemplary QFPs for use with A/D converters of the present invention.

FIG. 1 shows a QFP for use in a preferred A/D converter. The FIG. 1 QFP functions as an analog current comparator using the rising edge of a clock signal to sample the analog signal.

The FIG. 1 QFP includes superconducting loops formed by inductors 2, 4, 6 (labelled $L_1$, $L_2$, $L_3$ respectively), Josephson junctions 8 and 10 (labelled $J_1$ and $J_2$ respectively) and shunt resistors 12 and 14 connected in parallel with Josephson junctions $J_1$ and $J_2$, respectively. Josephson junctions $J_1$ and $J_2$ form first and second arms, respectively of the FIG. 1 QFP. The shunt resistors damp oscillations in the QFP.

The FIG. 1 QFP is symmetric about the inductor 6. For example, the inductors 2 and 4 are equal value, the critical currents of the Josephson junctions $J_1$ and $J_2$ are of equal value and the shunt resistors 12 and 14 are of equal value. A flux input 16 provides a clocking input to the FIG. 1 QFP in a manner as described, for example, in the aforementioned U.S. Pat. No. 4,623,804.

The accuracy of the FIG. 1 circuit depends upon the symmetry of the comparator means. More particularly, accuracy depends upon the symmetry which exists between the two arms of the QFP.

Asymmetries of the comparator means can be introduced by processing variations which occur in the fabrication of the circuit. These variations can introduce a comparator threshold offset which severely limits detection resolution. The most significant source of error is attributable to differences in the critical currents of junctions $J_1$ and $J_2$.

Figure 2A:
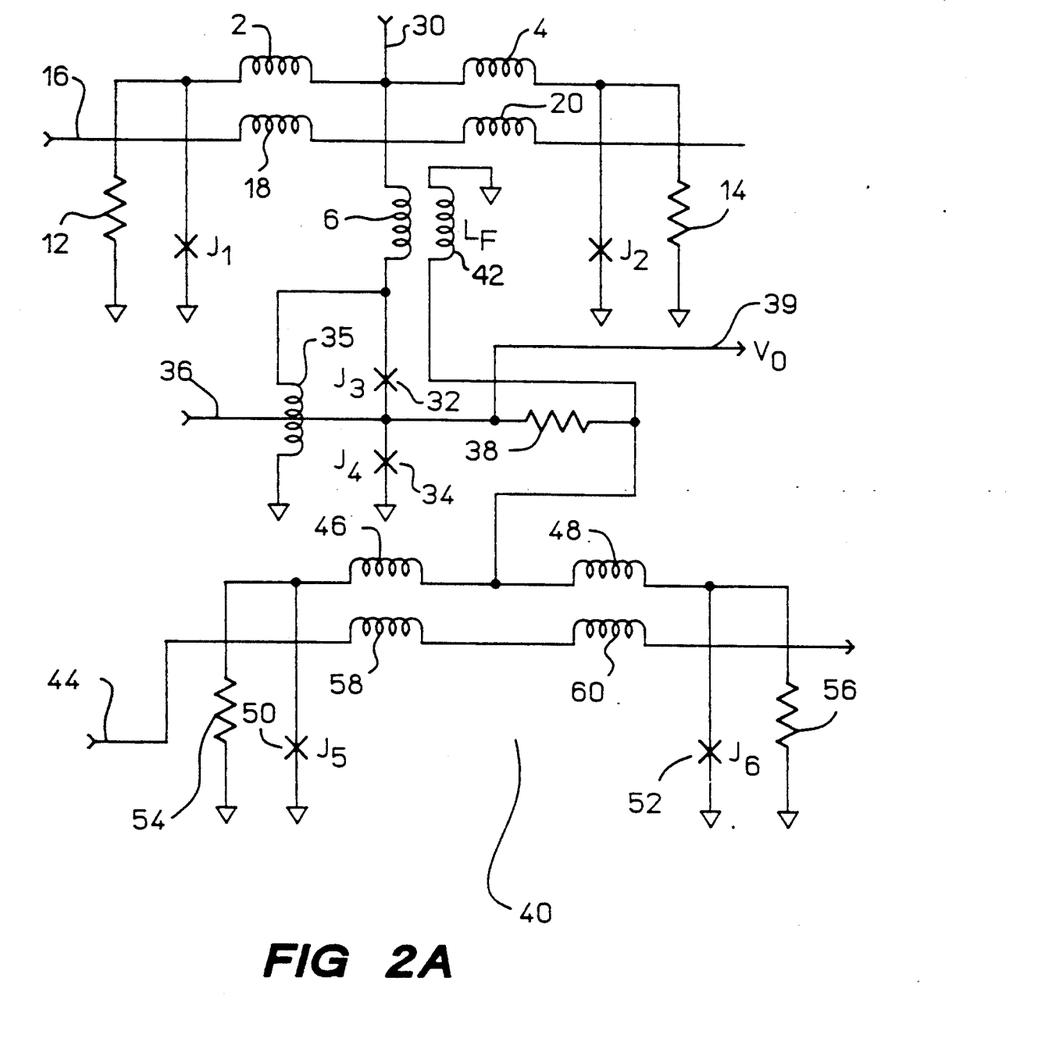

A modified QFP comparator which includes compensation for processing variations is shown in FIG. 2a. The FIG. 2a circuit includes an input means for inputting an analog waveform to be analyzed, a comparator means for comparing the analog waveform with a predetermined threshold and an output means for outputting a result of the comparison. The FIG. 2a circuit further includes a feedback means for compensating asymmetries in the FIG. 2a circuit.

The FIG. 2a input means includes a signal input 30. The FIG. 2a comparator means includes a QFP 31 which includes elements labelled to correspond with elements shown in the FIG. 1 QFP. The FIG. 2a comparator means further includes a read-out means, serial Josephson junctions 32, 34 (labelled $J_3$ and $J_4$ respectively) and inductor 35. The read-out means includes a latch input 36, a latch resistor 38 connected to a node between Josephson junctions $J_3$ and $J_4$ and a latch output 39. The junction $J_3$ isolates the QFP 31 from a read-out signal input via latch input 36.

The FIG. 2a feedback means includes another QFP 40. The latch output from the comparator means serves as an input signal to a center node of the feedback QFP 40.

The feedback QFP 40 includes a large output inductor 42 (labelled $L_f$) which acts as a flux store device weakly coupled to $L_3$. The feedback QFP further includes inductors 46, 48, Josephson junctions 50, 52 (labelled $J_5$ and $J_6$ respectively) and resistors 54, 56 arranged as described with respect to the QFP 31. A feedback drive line 44 includes inductors 58 and 60 magnetically coupled with inductors 46 and 48, respectively. The feedback drive line is used to selectively activate feedback compensation.

If the feedback drive line is active, a current passes through a control line of the feedback QFP and a single flux quanta with the same polarity as the latch output is injected and stored in the inductor $L_f$. The accumulated flux in $L_f$ is coupled to $L_3$ to create an effective current bias to the comparator QFP 31 and to provide negative feedback. After a sufficient number of feedback clock cycles with a fixed analog input, the FIG. 2a circuit reaches an equilibrium state where it switches to its positive state as often as it switches to its negative state. At this time the feedback drive is switched off, and the circuit functions as a simple threshold comparator.

In a preferred embodiment, the comparator means of FIG. 2a resets to its initial state if all current inputs except the analog input are switched off. This includes the flux input, the latch input and the feedback input. Stored energy is dissipated through the resistors of the comparator and feedback QFPs, respectively. An equivalent circuit of the feedback compensated FIG. 2a comparator circuit is shown as comparator 50 in FIG. 2b. Features of FIG. 2a have been similarly labelled in FIG. 2b.

Figures 2B, 3:
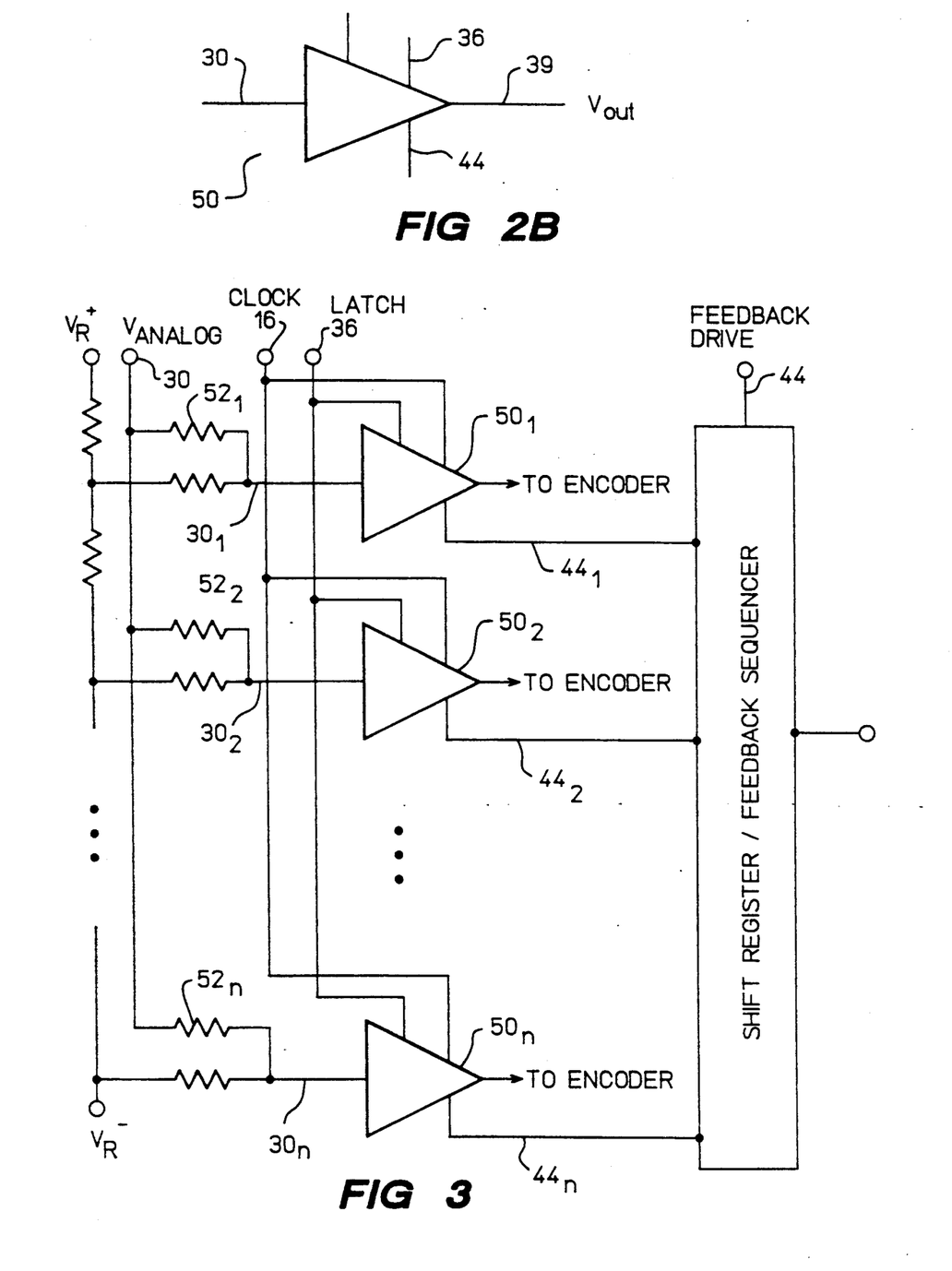
FIG. 2b shows an equivalent QFP comparator associated with the FIG. 2a comparator.
FIG. 3 shows an exemplary embodiment of an A/D converter designed in accordance with the present invention.
Figure 2C:
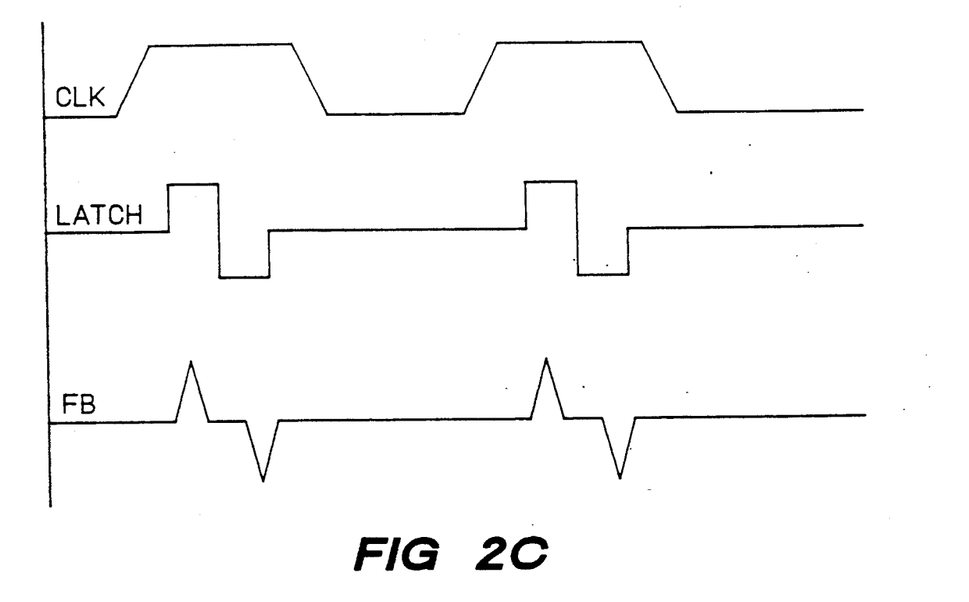
FIG. 2c shows a clocking sequence for the FIG. 2a comparator.

In operation, a clock signal shown as the signal CLK in FIG. 2c is provided as the flux input. If the analog input signal is positive at the time that clock signal crosses the threshold of the QFP, a positive current will flow in the load inductor $L_3$. Conversely, the current in $L_3$ will be negative if the analog signal is negative as described in the aforementioned U.S. Pat. No. 4,623,804.

The clocking sequence for the feedback operation is shown in FIG. 2c. Both positive and negative pulses must be present in the latch clock labelled LATCH in FIG. 2c for the feedback QFP to add and subtract flux from the storage inductor. In the normal operation of the comparator, a unipolar latch clock will be sufficient to determine the state of the comparator QFP. The polarity of the feedback clock shown as the signal FB in FIG. 2c can be arbitrary.

Nominal design values for the QFP are $L_1 = L_2 = 1$ pH, $L_3 = 3$ pH. Nominal critical currents are $I_c = 0.2$ mA, and the damping resistors are 3 ohms each. The latch and feedback QFP junctions also have critical currents of 0.2 mA. The latch inductor 35 is, for example, 2 pH, the inductors 46 and 48 are 1 ph, and the large storage inductor is 1.5 nH.

The polarity of current in the output load can either be detected indirectly or directly. For example, in the exemplary FIG. 2a embodiment, direct detection of current is effected by injecting a detection, or read-out current into the Josephson junction $J_4$ via the latch bias control signal input (i.e., latch clock).

To read a stored state from the FIG. 2a comparator, a read-out current is injected via latch input 36 into $J_4$. If this read-out current is selected positive (e.g., positive pulse step waveform), then a stored positive load current will switch $J_4$ into a positive voltage state and a stored negative load current will leave $J_4$ in a superconducting state. Alternately, if a negative read-out current (e.g., negative pulse step waveform) is selected, $J_4$ will switch to a negative voltage state if the stored load current is negative while a stored positive load current will leave $J_4$ superconducting.

The feedback of the FIG. 2a circuit is triggered by the feedback clock on input 44 and can be used to null offsets due to processing variations, or to program a non-zero threshold. The FIG. 2a circuit can therefore be used to construct a single flash A/D converter that takes full advantage of superconductive electronic speed and that is insensitive to processing variations.

FIG. 3 shows a single flash A/D converter which includes a shift register to sequence threshold adjustment of a plurality of the FIG. 2b comparator circuits labelled $50_1$ to $50_n$. In an exemplary embodiment, the thresholds of the comparators used in the FIG. 3 A/D converter are set during a start up sequence. Reference voltages $V+_R$ and $V-_R$ are used to apply a reference voltage to the analog input of each FIG. 3 comparator via a voltage divider. The first bit of the shift register is then loaded to enable feedback in the first comparator $50_1$ by activating the feedback drive signal $44_1$. Further, a voltage equal to the highest selected threshold voltage of the A/D converter is connected to the analog input node of all comparators via resistors $52_1$ to $52_n$, respectively.

Subsequently, clock input 16, latch input 36 and feedback drive 44 are activated (e.g., the flux signal CLK, latch clock LATCH and feedback clock FB signals rise). A sufficient number of clock cycles are provided until the comparator $50_1$ reaches equilibrium. Upon comparator $50_1$ reaching equilibrium, the feedback drive is switched to the next comparator $50_2$. When the feedback is shifted, the analog voltage input 30 is reduced by one quantization level. A sufficient number of clock cycles are provided for the comparator $50_2$ to reach equilibrium.

The steps of shifting and reducing are repeated until all comparators $50_1$ to $50_n$ are adjusted. The feedback drive is then turned off and the analog input voltage disconnected.

After completion of the start up sequence, the operation of the FIG. 3 A/D converter can proceed like other conventional flash A/D converters. Since the comparators are programmed with the proper thresholds through the analog input, all resistor variations as well as variations internal to the comparators can be compensated.

In an alternate embodiment, direct injection of the analog signal into the QFP of each FIG. 3 comparator can be replaced with an inductive coupling of the input to $L_3$. The analog signal can then be passed through the comparators $50_1$ to $50_n$ in series. This alternate embodiment has the advantage of requiring a much lower input current, but requires very precise matching between the clock input and signal path lengths.

In addition to signal offsets, the aforementioned QFP feedback compensation can be applied to adjust the trigger time of the FIG. 3 comparators. This eliminates unwanted timing offsets between comparators in the circuit. An exemplary implementation of an A/D converter which includes timing adjustments is illustrated with the QFP circuit shown in FIG. 4a.

Figure 4A:
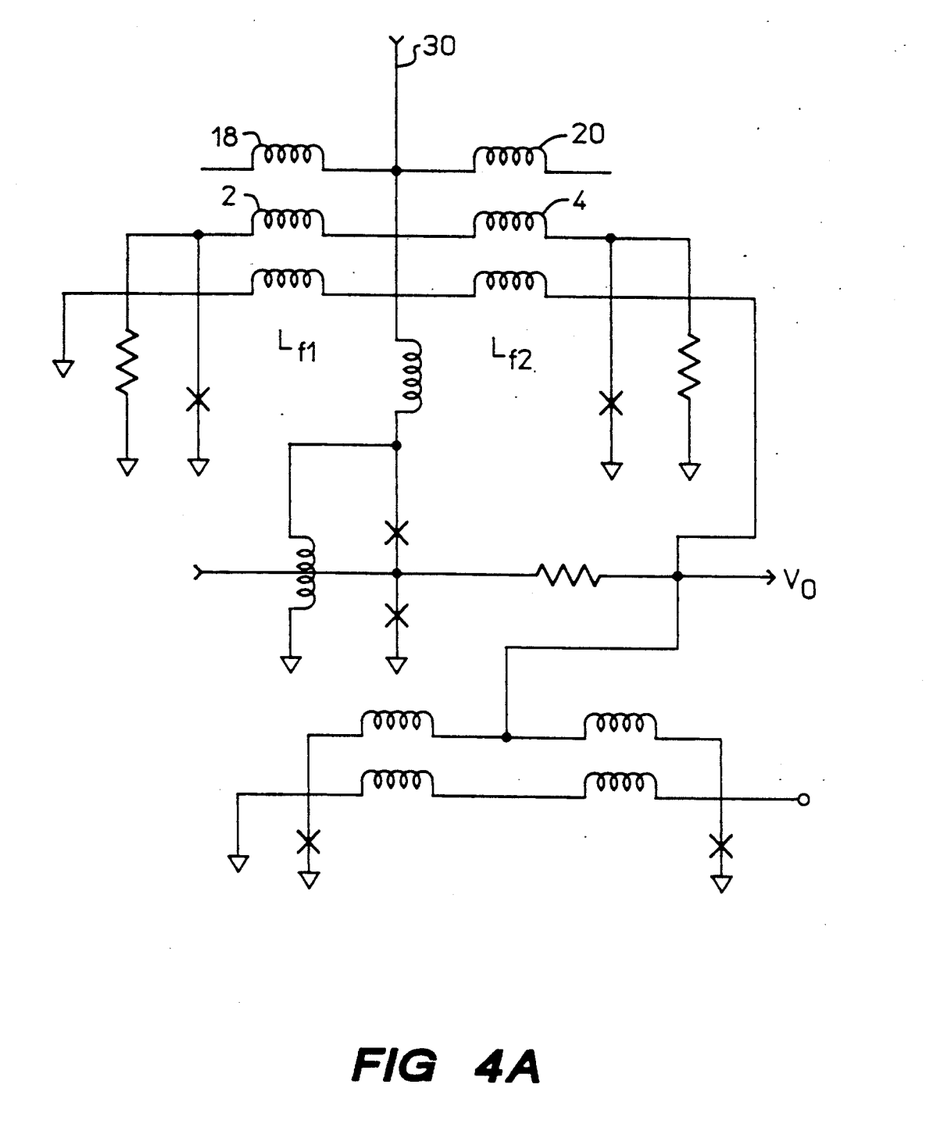
Figure 4B:
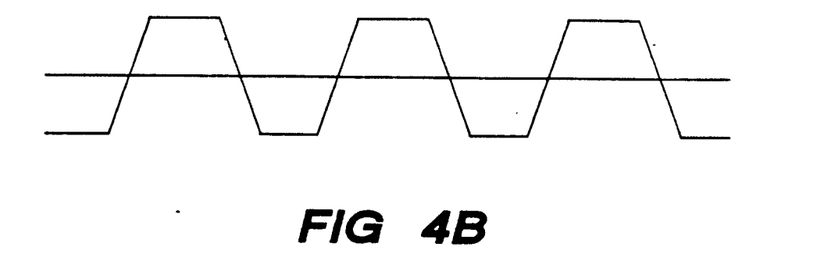
Figure 4C:
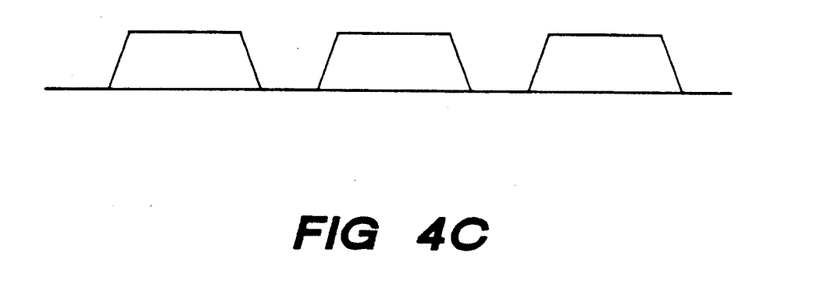
Figure 4D:
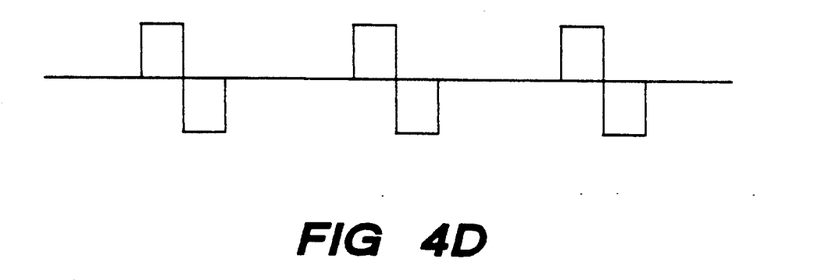
Figure 4E:
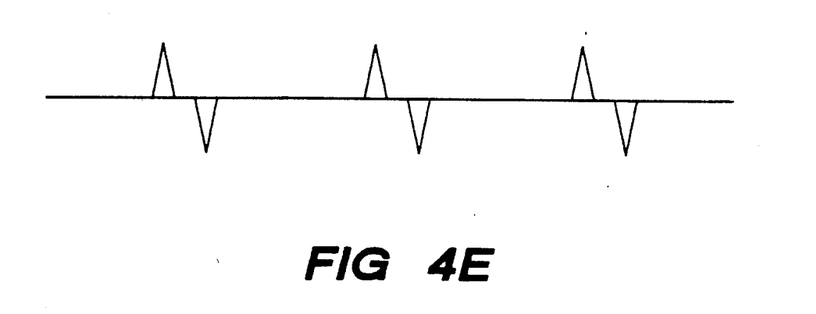

The FIG. 4a circuit is identical to the threshold compensation circuit shown in FIG. 2a except that the feedback inductor $L_f$ includes inductors $L_{f1}$ and $L_{f2}$ coupled to the inductors $L_1$ and $L_2$ of the comparator instead of the inductor $L_3$. Rising signals are applied as the analog input and as the clock input to the comparator. If the clock input triggers the comparator before the analog signal reaches the zero crossing, a negative output will result. This output is then used by the feedback circuit in the manner described above and a negative flux quantum is injected into the feedback inductor.

The coupling of inductors $L_{f1}$ and $L_{f2}$ with inductors $L_1$ and $L_2$ decreases the DC level of the clock input as seen by the comparator and delays the comparator trigger time. Therefore, after a sufficient number of iterations, the trigger time will coincide with the time when the analog signal reaches threshold. Similarly if the clock is slow, the feedback will increase the DC level and advance the comparator trigger. FIGS. 4b, 4c, 4d and 4e show exemplary input signals for each of the analog input, the flux (i.e., clock) input, the latch (read-out) input and the feedback input, respectively.

In an alternate embodiment, a one-junction SQUID comparator can be used in place of the FIG. 2a comparator QFP. For example, FIG. 5a shows a one-junction SQUID comparator with feedback compensation which can be used for each of the FIG. 3 comparators.

Figure 5A:
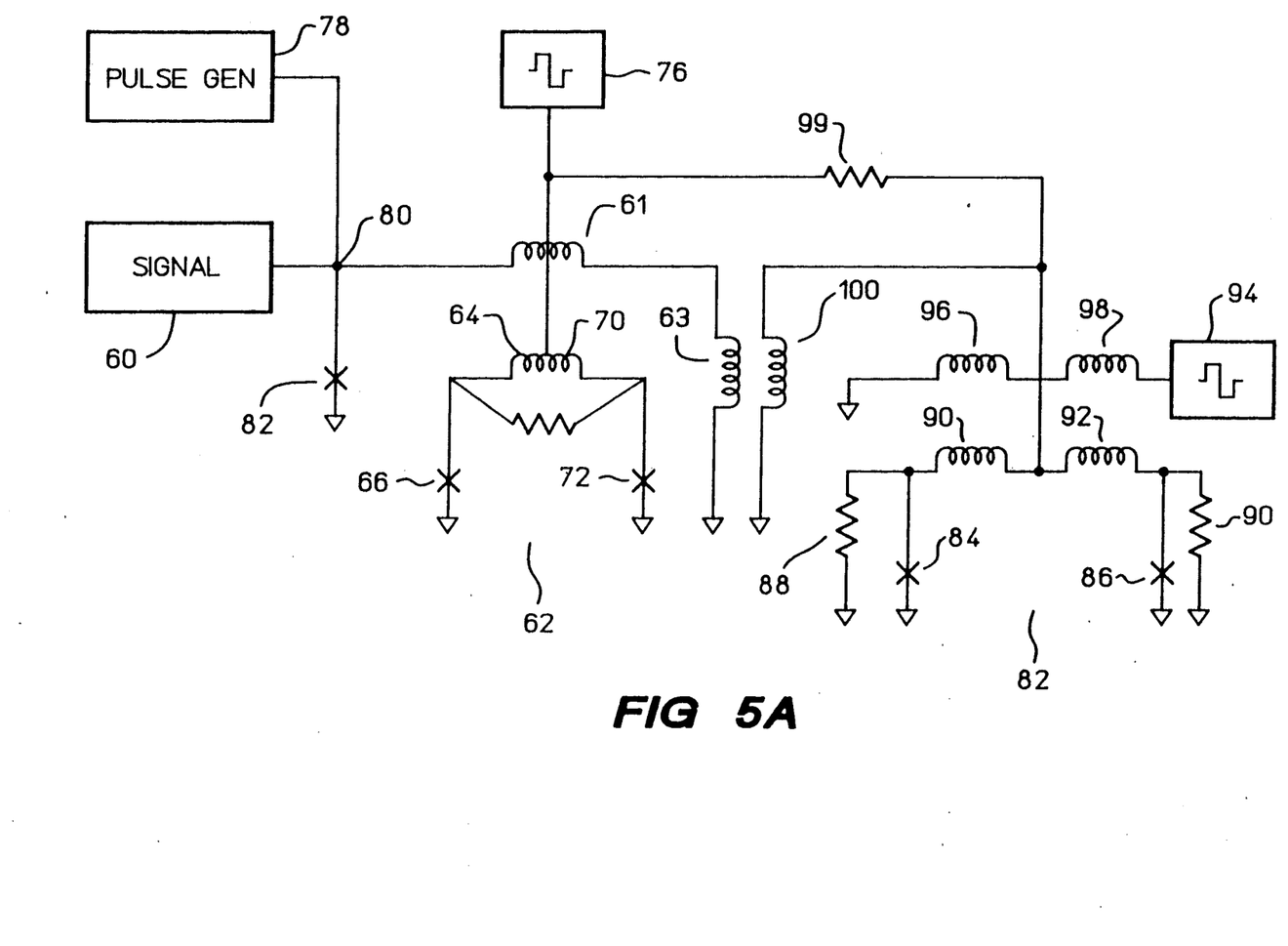
FIG. 5a shows an exemplary embodiment of a one-junction SQUID comparator with feedback.

The FIG. 5a SQUID includes means for inputting an analog signal, means for comparing the amplitude of the analog signal with a threshold, means for outputting a result of the comparison and feedback means for compensating processing variations in the comparator means. Because a SQUID can be used as a magnetic flux comparator in a manner similar to that of a QFP, the FIG. 5a SQUID includes features similar to elements of the FIG. 2a QFP.

More particularly, the input means includes an analog signal input 60. The comparator means includes a one-junction SQUID 82 in series with inductors 61 and 63. A flux bias input of the comparator means is represented as bipolar flux input 76 and QFP 62 formed with two arms. A first arm of QFP 62 includes inductor 64 and Josephson junction 66 ($J_1$). A second arm includes inductor 70 and Josephson junction 72.

The output means includes a pulse generator 78. The pulse generator is connected to the analog signal input at a node 80. The node 80 is grounded through Josephson junction 82 and is thus included as part of the one-junction superconductive loop with inductors 61 and 63.

The feedback means includes a feedback QFP 82 having a loop formed by Josephson junctions 84, 86, shunt resistors 88, 90 and inductors 90, 92. A feedback drive line includes a bipolar drive input 94 connected serially with inductors 96 and 98. The inductors 96 and 98 are inductively coupled with the inductors 90 and 92 of the feedback QFP. Further, the feedback QFP includes an inductor 100 coupled with the inductor 63 of the input means, and a line coupled to the flux input via a resistor 99.

Figure 5B:
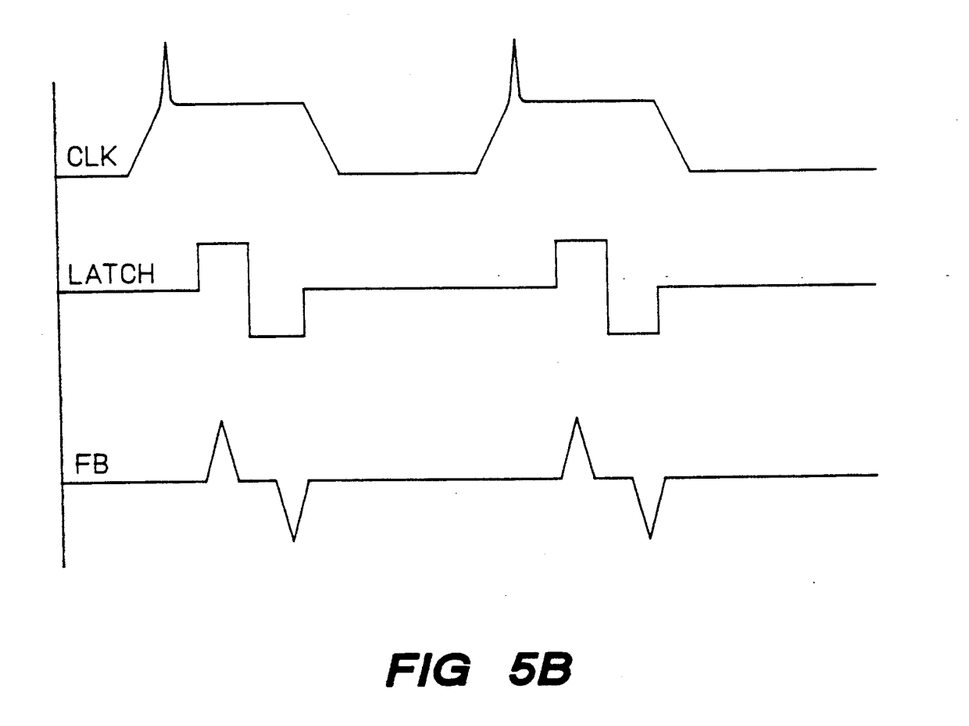
FIG. 5b shows a clocking sequence for the FIG. 5a comparator.

Operation of the FIG. 5a one-junction SQUID comparator is similar to that described above with respect to the FIG. 2a QFP. This is reflected by the similarity of the FIG. 5a clocking sequence shown in FIG. 5b relative to the clocking sequence shown in FIG. 2c, the key difference being the sharp rise which occurs during the CLK signal risetime due to use of a SQUID. As with the FIG. 2a QFP, processing variations of the comparator means are offset during the programming of a comparator threshold by activating the feedback drive line until an equilibrium state is attained where the SQUID switches to its positive state as often as it switches to its negative state. Operation of the FIG. 3 A/D converter using the FIG. 5a one-junction SQUID for each of the comparators $50_1$ to $50_n$ is identical to that described previously.

It will be appreciated that the present invention can be embodied in other specific forms without departing from the spirit or essential characteristics thereof. The present disclosed embodiments are therefore considered in all respects to be illustrative and not restrictive. The scope of the invention is indicated by the appended claims rather than the foregoing description, and all the changes that come within the meaning and range and equivalents thereof are intended to be embraced therein.

What is claimed is:

1. An apparatus for converting an analog input signal to a digital signal comprising:
    input means for inputting an analog signal;
    comparator means for comparing the analog signal with at least one predetermined threshold, said comparator means including first means for quantizing flux;
    output means for outputting a digital signal proportional to a value of said analog value in response to said comparison;
    feedback means for compensating variations in the comparator means; and
    feedback enabling means for selectively enabling said feedback means to establish an equilibrium state within said comparator means.

2. The apparatus according to claim 1, wherein said feedback means includes a second means for quantizing flux.

3. The apparatus according to claim 2, wherein said first means for quantizing flux includes a QFP.

4. The apparatus according to claim 2, wherein said first means for quantizing flux includes a SQUID.

5. The apparatus according to claim 2, wherein said second means for quantizing flux are SQUIDs.

6. Apparatus according to claim 3, wherein said output means further includes read-out means for controlling an output of said comparator means, said read-out means operating independently of said feedback enabling means.

7. Apparatus according to claim 1, wherein said comparator means includes a plurality of flux quantizing means, each of said flux quantizing means establishing a different predetermined threshold.

8. The apparatus according to claim 1, wherein said input means directly inputs the analog signal into said comparator means.

9. The apparatus according to claim 1, wherein said input means includes means for inductively coupling the analog signal with said comparator means.

10. Apparatus according to claim 1, wherein said feedback means includes means for adjusting a trigger time of said comparator means.

11. A method for controlling an A/D converter comprising the steps of:
    supplying a DC reference voltage to each of a plurality of comparators;
    supplying an AC reference signal to each of said plurality of comparators; and
    sequentially gating a feedback signal to each of said plurality of comparators to establish a stored flux equilibrium state in said each of said comparators wherein said AC reference signal is reduced by a predetermined amount to establish the stored flux equilibrium state in each of said plurality of comparators.

12. Method according to claim 11, further comprising a step of:
    controlling an output of each of said plurality of comparators independently of said sequentially gating of said feedback signal.

13. Method according to claim 11 further comprising a step of:
    adjusting a trigger time for each of said plurality of comparators.

14. Method according to claim 11, wherein said feedback signal is inductively gated to each of said plurality of comparators.

* * * * *